(12) United States Patent
Tanaka

(10) Patent No.: US 9,711,383 B2
(45) Date of Patent: Jul. 18, 2017

(54) FABRICATION METHOD OF SEMICONDUCTOR DEVICES AND FABRICATION SYSTEM OF SEMICONDUCTOR DEVICES

(71) Applicant: FUJI ELECTRIC CO., LTD., Kawasaki-shi (JP)

(72) Inventor: Yoko Tanaka, Yokohama (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 138 days.

(21) Appl. No.: 13/650,267

(22) Filed: Oct. 12, 2012

(65) Prior Publication Data

US 2013/0095613 A1   Apr. 18, 2013

(30) Foreign Application Priority Data

Oct. 14, 2011   (JP) .................................. 2011-227472
Aug. 2, 2012   (JP) .................................. 2012-172117

(51) Int. Cl.
*H01L 21/78*   (2006.01)
*H01L 21/67*   (2006.01)
(Continued)

(52) U.S. Cl.
CPC ...... *H01L 21/67132* (2013.01); *B25B 11/005* (2013.01); *H01L 21/67144* (2013.01);
(Continued)

(58) Field of Classification Search
CPC ............... H01L 21/6838; B25B 11/005; Y10T 156/1132; Y10T 156/1168; Y10T 156/1944; Y10S 156/93; Y10S 156/941
(Continued)

(56) References Cited

U.S. PATENT DOCUMENTS 4,711,014 A * 12/1987 Althouse ......................... 29/412
6,106,222 A *  8/2000 Tsuji et al. .................... 414/811
(Continued)

FOREIGN PATENT DOCUMENTS

JP   H04-088045 U   7/1992
JP   05-335405 A   12/1993
(Continued)

OTHER PUBLICATIONS

Office Action issued in Japanese Appln. No. 2012-172117 mailed Mar. 29, 2016. Partial English translation provided.
(Continued)

*Primary Examiner* — Mark A Osele
(74) *Attorney, Agent, or Firm* — Rossi, Kimms & McDowell LLP

(57) ABSTRACT

In aspects of the invention, a holding stage of a pick up system can include a first stage on which a semiconductor chip is mounted with an adhesive sheet put in between, a second stage supporting the first stage, and an evacuation pipe. The first stage can be provided with a plurality of grooves, projections each being formed with side walls of adjacent grooves, and air holes connected to the grooves. The semiconductor chip can be mounted on the first stage so that the whole end portion of the semiconductor chip does not position on one groove. Then, a closed space surrounded by the adhesive sheet and the first and second stages and can be evacuated to make the semiconductor chip held on the projections. Thereafter, the semiconductor chip can be picked up by a collet.

5 Claims, 8 Drawing Sheets

(51) Int. Cl.
  *B25B 11/00* (2006.01)
  *H01L 21/683* (2006.01)

(52) U.S. Cl.
  CPC ......... *H01L 21/6838* (2013.01); *Y10S 156/93* (2013.01); *Y10S 156/941* (2013.01); *Y10T 156/1132* (2015.01); *Y10T 156/1168* (2015.01); *Y10T 156/12* (2015.01); *Y10T 156/1944* (2015.01)

(58) Field of Classification Search
  USPC ................. 156/707, 758, 930, 941; 269/21
  See application file for complete search history.

(56) References Cited

U.S. PATENT DOCUMENTS

| | | | |
|---|---|---|---|
| 6,505,395 B1* | 1/2003 | Farnworth et al. | 29/559 |
| 6,561,743 B1* | 5/2003 | Nakatsu | H01L 21/67132 |
| | | | 156/750 |
| 8,182,649 B2* | 5/2012 | Watanabe et al. | 156/707 |
| 8,251,422 B2* | 8/2012 | Cheng | H01L 21/67333 |
| | | | 294/183 |
| 2001/0051086 A1* | 12/2001 | Blades | H01L 21/67766 |
| | | | 414/331.14 |
| 2007/0177125 A1* | 8/2007 | Shibazaki | G03F 7/70341 |
| | | | 355/72 |
| 2010/0289283 A1 | 11/2010 | Watanabe et al. | |

FOREIGN PATENT DOCUMENTS

| | | |
|---|---|---|
| JP | H06-204324 A | 7/1994 |
| JP | H10-242255 A | 9/1998 |
| JP | 11-054594 A | 2/1999 |
| JP | 2002280330 A | 9/2002 |
| JP | 2004311880 A | 11/2004 |
| JP | 2008-103493 A | 5/2008 |
| JP | 2010-123750 A | 6/2010 |

OTHER PUBLICATIONS

Decision of Refusal issued in Japanese Patent Application No. 2012-172117 mailed Mar. 21, 2017. English translation provided.
Decision to Decline the Amendment issued in Japanese Patent Application No. 2012-172117 mailed Mar. 21, 2017. English translation provided.

* cited by examiner (a)

(b)

FABRICATION METHOD OF SEMICONDUCTOR DEVICES AND FABRICATION SYSTEM OF SEMICONDUCTOR DEVICES

BACKGROUND

Field of the Invention

Embodiments of the invention relate to methods of fabricating semiconductor devices and methods of fabricating a system of semiconductor devices.

Related Art

In recent years, thickness reduction of the semiconductor wafer of an IGBT (Insulated Gate Bipolar Transistor) is being carried out for enhancing the performance and reducing the cost of the IGBT. For example, for enhancing the performance and reducing the cost of an IGBT, it is necessary to thin the thickness of a semiconductor wafer down to the order of 50 μm to 100 μm or less.

For a fabrication method of a semiconductor device with a reduced device thickness, the following has been proposed. According to the method, a large number of device structures are formed on the top surface of a semiconductor wafer before carrying out processing such as back grinding or silicon etching of the bottom surface of the semiconductor wafer until the thickness of the semiconductor wafer is reduced to become a specified thickness. Then, dicing is carried out for each of the device structures formed on the top surface of the semiconductor wafer to cut the semiconductor wafer for being separated into individual semiconductor chips each having the device structure.

For another fabricating method of a semiconductor device with a reduced device thickness, the following has been proposed. According to the method, after device structures are formed on the top surface of a semiconductor wafer, grooves are formed on dicing lines on the top surface of a semiconductor wafer each with a depth larger than the specified thickness of a completed semiconductor device, for example. Then, processing such as back grinding or silicon etching of the bottom surface of the semiconductor wafer is carried out until the thickness of the semiconductor wafer is reduced to become a specified thickness, by which the grooves formed on the top surface of a semiconductor wafer make the semiconductor wafer separated into individual semiconductor chips.

As another method of fabricating a semiconductor device with a reduced device thickness, the following has been proposed. According to the method, after device structures are formed on the top surface of a semiconductor wafer, processing such as back grinding or silicon etching of the bottom surface of the semiconductor wafer is carried out to thin only the middle section of the semiconductor wafer in the range with a diameter smaller than the diameter of the semiconductor wafer to leave the peripheral section (hereinafter referred to as a rib section) of the semiconductor wafer unprocessed. Then, dicing of the semiconductor wafer is carried out with the rib section being left unprocessed or after the rib section is removed to separate the semiconductor wafer into individual semiconductor chips.

In carrying out dicing of the semiconductor wafer in this way, for avoiding a problem of scattering semiconductor chips separated by dicing, a method is known in that dicing is carried out with an adhesive sheet such as a dicing sheet stuck onto the bottom surface of a semiconductor wafer, for example. After the dicing is carried out with the adhesive sheet stuck onto the bottom surface of a semiconductor wafer, semiconductor chips being stuck to the adhesive sheet to be fixed thereto are supplied to a pick up system for being picked up from the adhesive sheet to be separated into individual semiconductor chips.

For a method of picking up semiconductor chips from an adhesive sheet, the following has been proposed. According to the method, each of the semiconductor chips is pushed upward by a tool such as a needle, for example, from the side of the bottom surface, onto which the adhesive sheet is made to stick, to reduce the contact area of the semiconductor chip with the adhesive sheet. Then, by a tool such as a collet, suction is applied to the semiconductor chip pushed upward by the needle to pick up the semiconductor chip from the adhesive sheet. However, when such picking up method is applied to a thinned semiconductor chip, the needle pushing up the semiconductor chip might cause flaws on the bottom surface of the semiconductor chip or breakage of the semiconductor chip.

For solving such a problem, as a method of reducing the contact area of the semiconductor chip and the adhesive sheet without carrying out pushing by a needle, the following method is proposed. According to the method, a fixed jig is used which includes a jig base and an adhesion layer. The jig base has a plurality of projections and a side wall on one side. The adhesion layer is layered on the surface of the jig base having the projections and is bonded on the top surface of the side wall. On the surface of the jig base having the projections, zoned spaces are formed by the adhesion layer, the projections and the side wall. Each of the zoned spaces is connected to a vacuum source by a through hole. Through the through holes, suction is applied to the air in each of the zoned spaces to deform the adhesion layer. Along with this, from the top surface side of the chip, a collet applies suction to the chip to pick up the chip from the adhesion layer (see, e.g., Japanese patent publication no. J P-A-2008-103493).

As another method, the following method has been proposed. According to the method, on a stage having a plurality of suction grooves and a plurality of projections, chip-like pieces are mounted with adhesive holding sheets, bonded onto the bottom surfaces of the pieces, made to be in contact with the stage. A plurality of the suction grooves are distributed so as to cover regions facing the chip-like pieces and a plurality of the projections are made to be positioned so as to partially face each of the chip-like pieces at least at two positions between the suction grooves. By applying a negative pressure to the suction grooves, the holding sheets are removed from the chip-like pieces while being made deformed so as to be stuck along the projections. At this time, the negative pressure applied to the suction grooves facing the peripheral section of a chip-like piece is made to be stronger so that the holding sheet is removed from the peripheral section of the chip-shaped piece (see, e.g., Japanese patent publication no. JP-A-11-54594).

As yet another method, the following method has been proposed. According to the method, on the surface of an attraction piece on which surface the bottom surface side of a semiconductor chip is mounted with a dicing tape put in between, an attraction face and a side wall are provided. The attraction face has a plurality of projections of the same height provided so as to stand perpendicularly. Each of the projections has a top surface that is concave upward and approximately hemispherical. The side wall is provided over the whole periphery of the attraction face with a width of 0.4 mm or less and a height being equal to the height of the projection or having a difference less than 1 mm from the height of the projection. Moreover, a suction hole is provided in at least one of a bottom between adjacent projections, a side surface of the projection, or each of them. With each of the suction holes, the dicing tape is made attracted to the projection. Along with this, on the top surface side of the semiconductor chip, a collet picks up the semiconductor chip. When suction is applied to the dicing tape with the use of the suction holes, the suction is applied so that the dicing tape is made to be brought slightly downward between the side wall and the attraction face of the attraction piece within the elastic limit of the dicing tape (see, e.g., Japanese patent publication no. JP-A-2010-123750).

In addition, as a pick up system for preventing a semiconductor chip from such damage as being scratched, the following system is proposed. According to the system, a wafer stage includes a plurality of projections, a plurality of suction grooves and a vacuum unit. A plurality of the projections hold the bottom surface of each of IC chips at their tops through an adhesive sheet. A plurality of the suction grooves are formed in some of bottom sections each formed between adjacent projections of a plurality of the projections. The vacuum unit is connected to the suction groves through connection tubes and generates a force of attraction at the suction grooves to thereby separate the adhesive sheet from the IC chip for making the adhesive sheet attracted to the bottom sections each formed between the adjacent projections (see, e.g., Japanese patent publication no. JP-A-5-335405).

With each of the methods of the related art disclosed in the foregoing, however, the following problems arise as shown in FIG. 16. FIG. 16 is a cross-sectional view showing semiconductor chips in a state of being held on a holding stage in a related fabrication system of semiconductor devices. In FIG. 16, a state is shown in which an adhesive sheet 102 securing a plurality of semiconductor chips 101a is deformed so as to be stuck along projections 111a on a holding stage 111. When the adhesive sheet 102 is made to be deformed as shown in FIG. 16, the difference in timing at which the adhesive sheet 102 is removed from the same bottom surface of a semiconductor chip 101a-1 brings the semiconductor chip 101a-1 into a state of being inclined to the holding stage 111 in applying suction to the semiconductor chip 101a-1 by a collet.

In the case when the semiconductor chip 101a-1 is brought into the state of being inclined to the holding stage 111, there is the possibility of causing one end portion of the semiconductor chip 101a-1 to contact with an end portion of an adjacent semiconductor chip 101a-2 to make the semiconductor chips 101a-1 and 101a-2 get chipped. Also in the case when the semiconductor chip 101a-1 is brought into the state of being inclined to the holding stage 111, there is the possibility of causing the end portion on the raised side of the semiconductor chip 101a-1 to hit a collet (not shown) to damage the semiconductor chip 101a-1.

In addition, the ease of deformation of the adhesive sheet 102 attracted to the projections 111a differs depending on factors such as that the adhesion of the semiconductor chip 101a to the adhesive sheet 102 differs depending on the surface roughness or the presence or absence of a metal film of the bottom surface of the semiconductor chip 101a and that the adhesion or stiffness of the adhesive sheet 102 varies depending on the kind of the base material and the quality of the material forming the adhesive sheet 102. Thus, it is difficult to control the constant deformation of the adhesive sheet 102 into the form of the projections 111a. Therefore, with the methods of the related art explained in the foregoing, it is impossible to prevent the semiconductor chip 101a-1 from being brought into a state of being made inclined to the holding stage 111.

Thus, there is a need in the art for to provide a fabrication method of semiconductor devices and a fabrication system of semiconductor devices in which a semiconductor chip is brought into a state of being made inclined to a holding stage.

SUMMARY OF THE INVENTION

Embodiments of the invention address this and other needs.

A fabrication method of semiconductor devices according to embodiments of the invention is a fabrication method of semiconductor devices for picking up a semiconductor chip, which is formed by cutting a semiconductor wafer stuck to an adhesive sheet with dicing, from the adhesive sheet, the method being characterized by including the steps of: preparing a stage having a plurality of grooves on the upper surface thereof, an evacuation means, and a suction means applying suction to the semiconductor chip; mounting the semiconductor chip on the stage so that the direction of an end portion of the semiconductor chip forms a specified angle with the direction of the grooves on the stage with the side of the surface of the semiconductor chip having the adhesive sheet stuck thereto made to be on the stage side; making the semiconductor chip held at top portions formed by the end portions on the opening side of the grooves on the stage with the adhesive sheet put in between with a space, surrounded by the adhesive sheet contacting the stage and the grooves on the stage, being evacuated by the evacuation means; and applying suction to the semiconductor chip held at the top portions by the suction means to pick up the semiconductor chip.

In some embodiments, in the step of mounting the semiconductor chip, the semiconductor chip being mounted on the stage so that, on the stage side surface of the semiconductor chip, the top portion is in contact with at least one side as one of the end portions of the semiconductor chip.

In some embodiments, in the step of making the semiconductor chip held, the space is evacuated to deform the adhesive sheet that is stuck to the semiconductor chip so as to be stuck along the side walls of the grooves, thereby making the semiconductor chip held at the top portion.

In some embodiments, in the step of making the semiconductor chip held, the space is evacuated to the extent that contact portions of the semiconductor chip with the adhesive sheet becomes only portions corresponding to the top portions, thereby making the semiconductor chip held at the top portion.

A fabrication system of semiconductor devices according to some embodiments includes a fabrication system of semiconductor devices for picking up a semiconductor chip, which is formed by cutting a semiconductor wafer stuck to an adhesive sheet with dicing, from the adhesive sheet, the system being characterized by including: a stage on which the semiconductor chip is mounted, the stage having a plurality of grooves formed at specified intervals on the surface thereof on which the semiconductor chip is mounted and at least one air hole formed in the stage to be connected to at least one of the grooves; top portions formed by the end portions on the opening side of the grooves for holding the semiconductor chip thereon with the adhesive sheet put in between; an evacuation means for evacuating a space through the air hole, the space being surrounded by the adhesive sheet stuck to the stage side surface of the semiconductor chip mounted on the stage and the grooves which the stage has thereon; and a suction means applying suction to the semiconductor chip to pick up the semiconductor chip being held only at the top portions with the space evacuated by the evacuation means, in which system the semiconductor chip is mounted on the stage so that the direction of an end portion of the semiconductor chip forms a specified angle with the direction of the grooves with the side of the surface of the semiconductor chip having the adhesive sheet stuck thereto made to be on the stage side.

In some embodiments, the semiconductor chip is mounted on the stage so that, on the stage side surface of the semiconductor chip, the top portion is in contact with at least one side as one of the end portions of the semiconductor chip.

In some embodiments, a plane being in area contact with the semiconductor chip is provided on the top portion.

In some embodiments, the evacuation means evacuates the space to make the adhesive sheet stuck to the semiconductor chip deformed so as to be stuck along the side walls of the grooves.

In some embodiments, the evacuation means evacuates the space to the extent that the size of each of contact portions of the semiconductor chip with the adhesive sheet becomes the size of only the portion corresponding to the top portion.

A fabrication system of semiconductor devices according to some embodiments includes a fabrication system of semiconductor devices for picking up a semiconductor chip, which is formed by cutting a semiconductor wafer stuck to an adhesive sheet with dicing, from the adhesive sheet, the system being characterized by including: a stage on which the semiconductor chip is mounted, the stage having a plurality of grooves formed at specified intervals on the surface thereof on which the semiconductor chip is mounted and at least one air hole formed in the stage to be connected to at least one of the grooves; top portions formed by the end portions on the opening side of the grooves for holding the semiconductor chip thereon with the adhesive sheet put in between; an evacuation means for evacuating a space through the air hole, the space being surrounded by the adhesive sheet stuck to the stage side surface of the semiconductor chip mounted on the stage and the grooves which the stage has thereon; a suction means applying suction to the semiconductor chip to pick up the semiconductor chip being held only at the top portions with the space evacuated by the evacuation means; and a driving means making one of the stage and the semiconductor chips turn so that the direction of an end portion of the semiconductor chip forms a specified angle with the direction of the grooves when mounting the semiconductor chip on the stage.

According to some embodiments, on the stage side surface of the semiconductor chip having a rectangular plan shape, the top portion of at least one projection is brought into contact with at least one of the end portions equivalent to one side of the semiconductor chip with the adhesive sheet put in between. Thus, by the evacuation means, the space (closed space) surrounded by the adhesive sheet and the side walls of the grooves is evacuated. Consequently, when portions of the adhesive sheet facing the grooves are removed from the semiconductor chip, on the stage side surface of the semiconductor chip, each of the end portions are made to have portions adhered to the adhesive sheet and portions not adhered to the adhesive sheet produced. Therefore, when suction is applied to the semiconductor chip by the suction means, the attraction force exerted by the adhesive sheet to attract each of the end portions of the semiconductor chip toward the stage side is made to be distributed. Thus, when suction is applied to the semiconductor chip by the suction means, no semiconductor chip is brought into a state of being inclined to the stage. This can prevent the semiconductor chip from being chipped and scratched due to the semiconductor chip being made inclined to the stage.

Moreover, according to some embodiments, by the evacuation means, portions of the adhesive sheet facing the grooves are removed from the semiconductor chip, by which the semiconductor chip is held only by a plurality of the top portions with the adhesive sheet put in between. This can reduce the adhesion between the semiconductor chip and the adhesive sheet to the extent that allows the semiconductor chip to be picked up only by the suction force of the suction means. Thus, when the semiconductor chip is picked up by the suction means, there is no need of carrying out processing of pushing the semiconductor chip upward by a tool such as a needle like in the related method. Therefore, the top surface of the semiconductor chip can be prevented from being scratched by a tool such as a needle.

By way of some embodiments, there is an advantageous effect that allows a semiconductor chip to be removed from an adhesive sheet to be picked up in a high quality condition.

DETAILED DESCRIPTION

Figure 1:
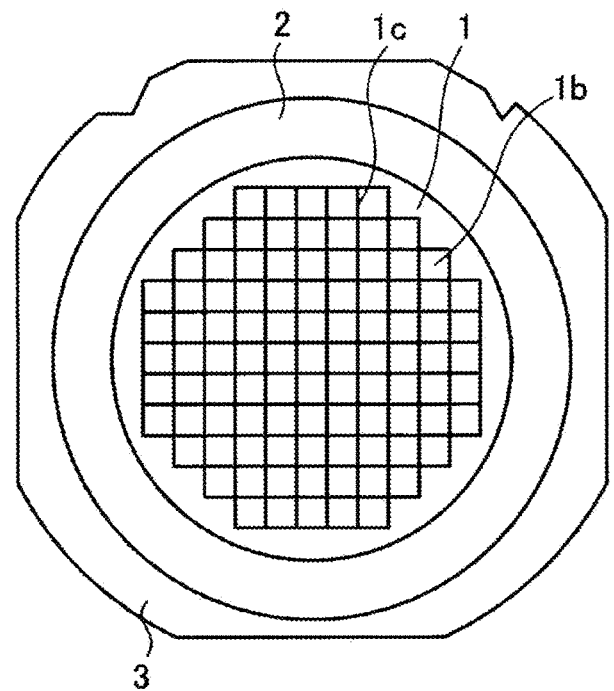
FIG. 1 is a plan view showing a semiconductor wafer processed by the fabrication system of semiconductor devices according to some embodiments of the invention.

In the following, embodiments of a fabrication method of semiconductor devices and a fabrication system of semiconductor devices will be explained in detail with reference to the attached drawings. In the following explanations of the embodiments and the attached drawings, the same constituents are designated by the same reference numerals or signs with repetition of the explanation thereof omitted.

Figure 2:
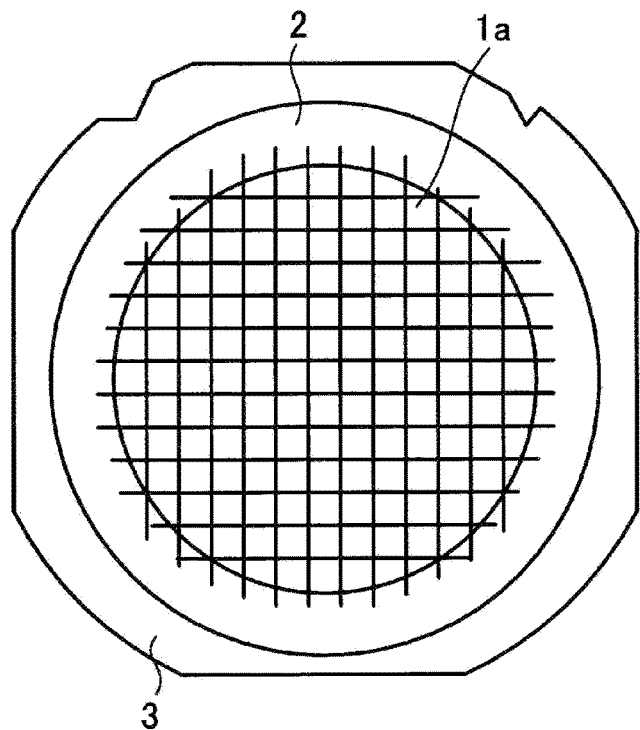
FIG. 2 is a plan view showing the semiconductor wafer shown in FIG. 1 in a state after being subjected to dicing.

FIG. 1 is a plan view showing a semiconductor wafer processed by the fabrication system of semiconductor devices according to an embodiment. FIG. 2 is a plan view showing the semiconductor wafer shown in FIG. 1 in a state after being subjected to dicing. First, an explanation will be made with respect to a semiconductor wafer 1 before being processed by the fabrication system of semiconductor devices according to the embodiment. As shown in FIGS. 1 and 2, the semiconductor wafer 1 is subjected to dicing with an adhesive sheet (dicing sheet) 2 being stuck thereto to be cut into individual semiconductor wafers 1a on each of which a surface structure (electronic circuit) of a device is formed.

Specifically, the semiconductor wafer 1 is subjected to dicing to be cut into individual semiconductor chips 1a as follows, for example. First, as shown in FIG. 1, in each semiconductor chip forming region 1b, a surface structure of a device is formed on the top surface side of the semiconductor wafer 1. The semiconductor chip forming regions 1b are arranged in island-like at equal intervals, for example. Between adjacent semiconductor chip forming regions 1b, a mark such as a dicing line 1c is formed.

Next to this, back grinding and silicon etching is carried out on the bottom surface of the semiconductor wafer 1 to thin the semiconductor wafer 1 to the extent that the thickness of the wafer 1 becomes a specified one. At this time, the semiconductor wafer 1 can be a wafer with a flat bottom surface or can be formed as a ribbed wafer with the peripheral section (rib section) on the bottom surface side made remained. Then, onto the bottom surface side of the thinned semiconductor wafer 1, the adhesive sheet 2 is made to be stuck. The adhesive sheet 2 is used for preventing the semiconductor chips 1a separated by dicing from being scattered.

Following this, onto the semiconductor wafer 1 side surface of the adhesive sheet 2, a dicing frame 3 is stuck to thereby fix the semiconductor wafer 1 to the dicing frame 3. Then, along the dicing line 1c, dicing of the semiconductor wafer 1 is carried out from the top surface side of the semiconductor wafer 1. At this time, the dicing is carried out so that a groove formed by the dicing does not penetrate the adhesive sheet 2. Thus, the semiconductor wafer 1 is cut into individual semiconductor chips 1a as shown in FIG. 2.

The thickness of the adhesive sheet 2 is desirably between 20 μm and 200 μm, for example. The reason is that the thickness of the adhesive sheet 2 more than 200 μm causes the stiffness of the adhesive sheet 2 to become so high that the adhesive sheet 2 becomes hard to be deformed along the side walls of grooves provided on a holding stage as will be explained later, which makes it impossible to remove the adhesive sheet 2 from the semiconductor chip 1a when the semiconductor chip 1a is picked up from the adhesive sheet 2 by the fabrication system of semiconductor devices according to the embodiment.

The individual semiconductor chips 1a cut from the semiconductor wafer 1 are still in a state of being stuck to the adhesive sheet 2. Thus, they are picked up from the adhesive sheet 2 by a fabrication system of semiconductor devices according to the embodiment explained later to be separated from one another. That is, the fabrication system of semiconductor devices according to the embodiment is a pick up system that picks up a semiconductor chip 1a stuck to the adhesive sheet 2 from the adhesive sheet 2.

Figure 3:
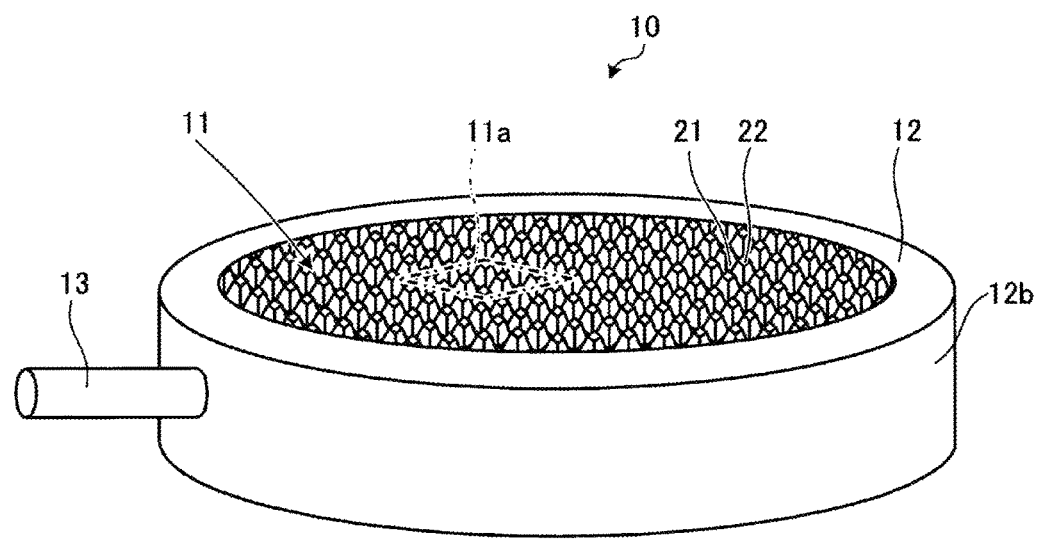
FIG. 3 is a perspective view schematically showing a principal part of the fabrication system of semiconductor devices according to some embodiments.
Figure 4:
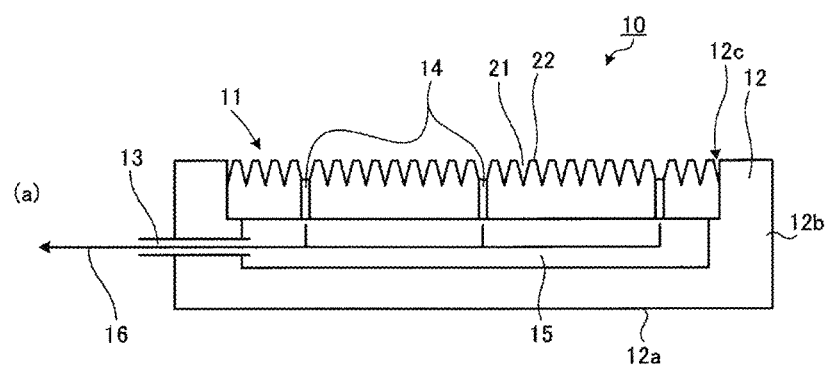
FIGS. 4(a) and 4(b) are cross-sectional views schematically showing the principal part of the fabrication system of semiconductor devices according to some embodiments.
Figure 4:
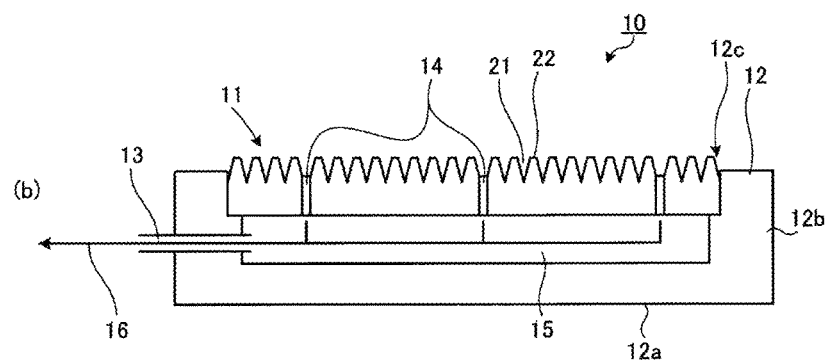

Subsequent to this, an explanation will be made with respect to the structure of the fabrication system of semiconductor devices (hereinafter referred to as a pick up system). FIG. 3 is a perspective view schematically showing a principal part of the fabrication system of semiconductor devices according to an embodiment. Moreover, FIG. 4 is a cross-sectional view schematically showing the principal part of the fabrication system of semiconductor devices according to the embodiment. As is shown in FIGS. 3 and 4, the pick up system is provided with a holding stage 10 including a first stage 11, a second stage 12 and an evacuation pipe 13. The first stage 11 has the semiconductor chips 1a mounted thereon with the adhesive sheet 2 put in between. The second stage 12 supports the first stage 11. The evacuation pipe 13 is provided for carrying out the evacuation of the holding stage 10.

The first stage 11 has a plurality of grooves 21, projections 22 formed with side walls of adjacent grooves 21 and air holes 14 connected to the grooves 21 on the surface on the side where the semiconductor chips are mounted (hereinafter referred to as the upper surface). The first stage 11 has a circular plane FIG., for example. Moreover, the first stage 11 is supported by the cylindrical side wall 12b of the second stage 12, having a surface 12a on one side (hereinafter referred to as a bottom surface) closed, so as to cover the opening 12c on the other side of the second stage 12.

The first stage 11 is supported by the side wall 12b of the second stage 12 with a surface on the opposite side to the upper surface of the first stage 11 (hereinafter referred to as a lower surface) being apart from the bottom surface 12a of the second stage 12. Moreover, the side surface of the first stage 11 is in contact with the inner surface of the side wall 12b of the second stage 12 so that no clearance appears in between. Thus, within the holding stage 10, an evacuation space 15 is formed which is surrounded by the first stage 11 and the second stage 12.

The evacuation space 15 is formed so as to connect the air holes 14 provided in the first stage 11 and the evacuation pipe 13 provided in the second stage 12. Each of the air holes 14 is formed so as to connect the groove 21 and the evacuation space 15 by penetrating the first stage 11 from the bottom of the groove 21 formed on the upper surface of the first stage 11. At least one air hole 14 is provided in the first stage 11.

The evacuation pipe 13 penetrates the side wall 12b, for example, of the second stage 12 to be exposed to the outside of the second stage 12. The section of the evacuation pipe 13 exposed to the outside of the second stage 12 is connected to an evacuation means (or an evacuator) through a valve the illustration of which is omitted. By carrying out evacuation with the evacuation means, an air flow (an arrow in a solid line) 16 is formed which passes the air holes 14, the evacuation space 15 and the evacuation pipe 13, by which the suction of the air on the upper surface side of the first stage 11 is carried out.

As will be explained later, on the upper surface of the first stage 11, semiconductor chips 1a are mounted with the surfaces thereof, onto which adhesive sheet 2 is stuck, made to be on the underside (on the first stage 11 side). Thus, by carrying out evacuation with the evacuation means, a space surrounded by the adhesive sheet 2, the side walls of the grooves 21 of the first stage 11 and the second stage 12 (hereinafter referred to as a closed space) is evacuated. This causes the adhesive sheet 2 to be deformed along the side walls of the grooves 21, by which portions of the adhesive sheet 2 facing the grooves 21 are removed from the semiconductor chips 1a.

The second stage 12, as shown in FIG. 4(a), is provided so that the height of the upper surface thereof becomes equal to the height of the upper surface of the first stage 11. Namely, the second stage 12 is provided so that the upper surface thereof is flat from the upper surface of the second stage 12 to the upper surface of the first stage 11. Instead, as shown in FIG. 4(b), in order that the holding stage 10 may be applicable to a ribbed wafer (not shown), the upper surface of the second stage 12 may be made to be lower by the thickness of the rib section of the ribbed wafer than the upper surface of the first stage 11. On the upper surface of the second stage 12, no groove 21 is provided. Thus, when the semiconductor chips 1a are mounted on the first stage 11 with the adhesive sheet 2 put in between, a closed space is formed which is surrounded by the adhesive sheet 2, the side walls of the grooves 21 of the first stage 11 and the second stage 12.

The evacuation means carries out evacuation of the closed space, surrounded by the adhesive sheet 2, the side walls of the grooves 21 of the first stage 11 and the second stage 12 and formed when the semiconductor chips 1a are mounted on the upper surface of the first stage 11 with the adhesive sheet 2 put in between. Moreover, the evacuation means makes the adhesive sheet 2, stuck to the semiconductor chips 1a, deformed so as to be stuck along the side walls of the grooves 21. Specifically, the evacuation means evacuates the closed space to the extent that the size of each of the portions at which the semiconductor chip 1a is in contact with the adhesive sheet 2 is brought down to the size of only the portion corresponding to the end portion of the projection 22 on the semiconductor chip 1a side (hereinafter referred to as a top portion).

Above the holding stage 10 of the pick up system, a collet (not shown) is provided which picks up the semiconductor chip 1a. The collet attracts a semiconductor chip 1a by applying suction thereto to pick up the semiconductor chip 1a from the first stage 11 after the closed space, surrounded by the adhesive sheet 2, the side walls of the groove 21 of the first stage 11 and the second stage 12, is evacuated.

Specifically, the collet applies suction to the semiconductor chip 1a to pick it up after the adhesive sheet 2 is deformed to the extent that the size of the portion at which the semiconductor chip 1a is in contact with the adhesive sheet 2 is brought down to the size of only the portion corresponding to the top of the projection 22. The collet is arranged with a specified gap apart from the semiconductor chip 1a held on the projections 22 of the first stage 11 with the adhesive sheet 2 put in between. The reason is that the semiconductor chip 1a can be picked up without pushing the collet onto the semiconductor chip 1a, which makes it possible to prevent a structure such as the device structure formed on the top surface of the semiconductor chip 1a from being damaged.

Furthermore, the pick up system may be provided with a heating means (not shown) for heating the adhesive sheet 2. By heating the adhesive sheet 2 with the heating means, the adhesive sheet 2 becomes easily deformed. Specifically, the heating means can be, for example, a heater heating the closed space surrounded by the adhesive sheet 2, the side walls of the grooves 21 of the first stage 11 and the second stage 12.

Control of the holding stage 10, the evacuation means, the collet and the heating means and control of a driving section, a detecting section and an image processing section that will be explained later are carried out by a CPU that executes specified programs with the use of programs and data recorded in a recording medium such as a ROM, a RAM, a magnetic disc and an optical disc in the pick up system.

Figure 5:
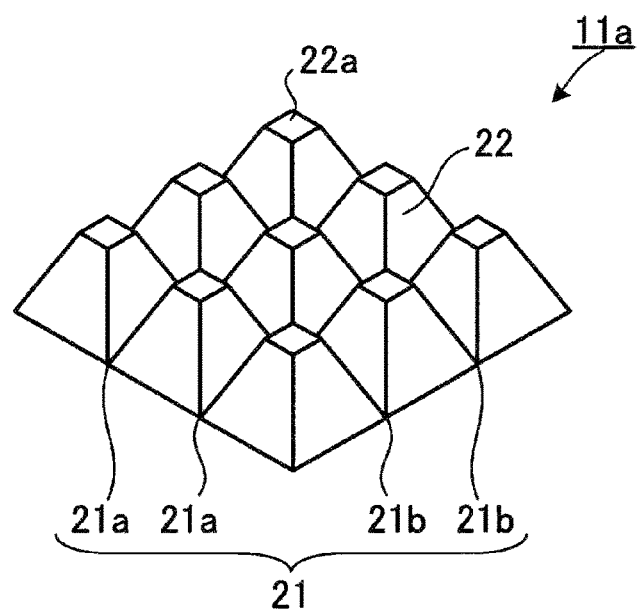
FIG. 5 is an enlarged perspective view schematically showing a principal part of the fabrication system of semiconductor devices according to some embodiments.

Next, a detailed explanations will be given with respect to the grooves 21 and the projections 22 in the first stage 11. FIG. 5 is an enlarged perspective view schematically showing a principal part of the fabrication system of semiconductor devices according to some embodiments. In FIG. 5, a part 11a of the first stage 11 shown in FIG. 3 is shown while being enlarged. As shown in FIG. 5, the grooves 21 are formed with a plurality of first grooves 21a provided at specified intervals and second grooves 21b provided perpendicularly to the first grooves 21a at specified intervals. The first and second grooves 21a and 21b are provided from the upper surface of the first stage 11 with a depth that does not reach the lower surface of the first stage 11.

The spacing between adjacent first grooves 21a and the spacing between adjacent second grooves 21b are desirably equal to or less than the length of the short side of a rectangular semiconductor chip 1a. The reason is that the short side of the semiconductor chip 1a can be held by at least two projections 22. The cross-sectional shape of each of the first and second grooves 21a and 21b is desirably an inverted triangular shape the width of which gradually becomes narrower toward the depth of the first stage 11 or a rectangular shape the width of which is approximately equal toward the depth of the first stage 11. The reason is that the first and second grooves 21a and 21b are feasible to be machined when they are formed on the upper surface of the first stage 11.

A plurality of the projections 22 are formed on the upper surface of the first stage 11 by a plurality of the first grooves 21a and a plurality of the second grooves 21b to hold the semiconductor chips 1a with the adhesive sheet 2 put in between. Each of the projections 22 is formed in truncated-pyramid-like. At the end portion (top portion) 22a of the projection 22 on the semiconductor chip 1a side, a plane is provided with which a semiconductor chip 1a makes area contact. The top portion 22a of the projection 22 is formed in a flat plane in parallel with the bottom surface, for example, of the semiconductor chip 1a held on the upper surface of the first stage 11. With the flat plane, the projection 22 makes area contact with the surface of the semiconductor chip 1a on the first stage 11 side.

The shape of the projection 22 can be a shape which allows a collet (not shown), which applies suction to the semiconductor chip 1a for picking it up, to pick up the semiconductor chip 1a on the projections 22 without causing the semiconductor chip 1a to be made inclined. Specifically, the shape of the projection 22 is not limited to be truncated-pyramid-like but can be pyramid-like or cube-like, for example. When the shape of the projection 22 is pyramid-like, the top portion 22*a* of the projection 22 makes point contact with the semiconductor chip 1*a*. Each of the projections 22 is provided with a height equal to one another so that each of the top portions 22*a* positions on the same plane.

The surface area of the top portion 22*a* of the projection 22 is determined depending on the force of suction of a collet picking up a semiconductor chip 1*a* held on the top portion 22*a* of the projection 22 with an adhesive sheet 2 put in between. Specifically, the surface area of the top portion 22*a* of each of the projections 22 is determined so that when the adhesive sheet 2 is in a state of being stuck to the semiconductor chip 1*a* only with the portion with an area equivalent to the surface area of the top portion 22*a* of the projection 22 at the position of each of the projections 22, the adhesion between the semiconductor chip 1*a* and the adhesive sheet 2 becomes an adhesion to the extent that a collet can pick up the semiconductor chip 1*a* from the adhesive sheets 2.

Figure 6:
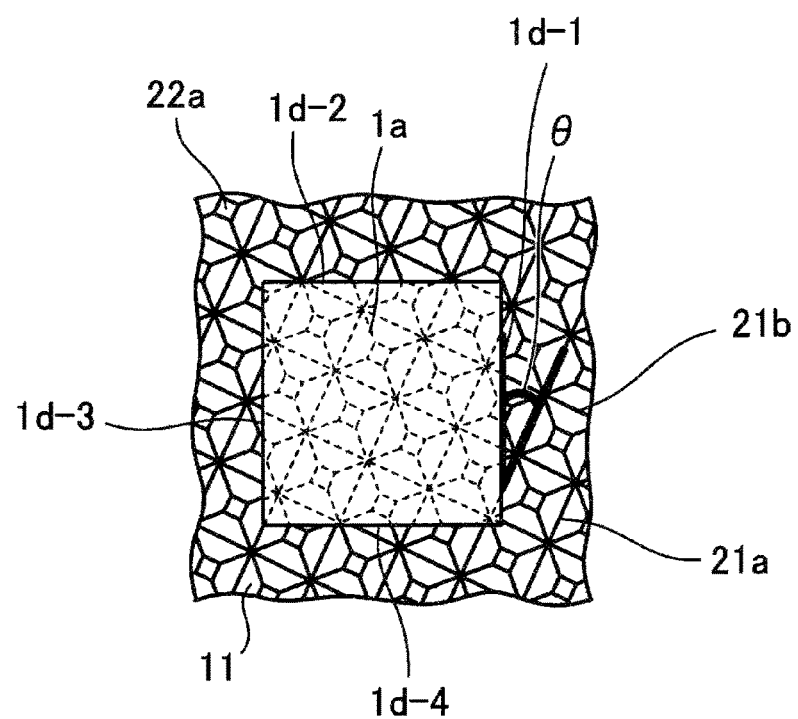
FIG. 6 is a plan view showing a semiconductor chip in a state of being mounted on the holding stage in the fabrication system of semiconductor devices according to some embodiments.
Figure 7:
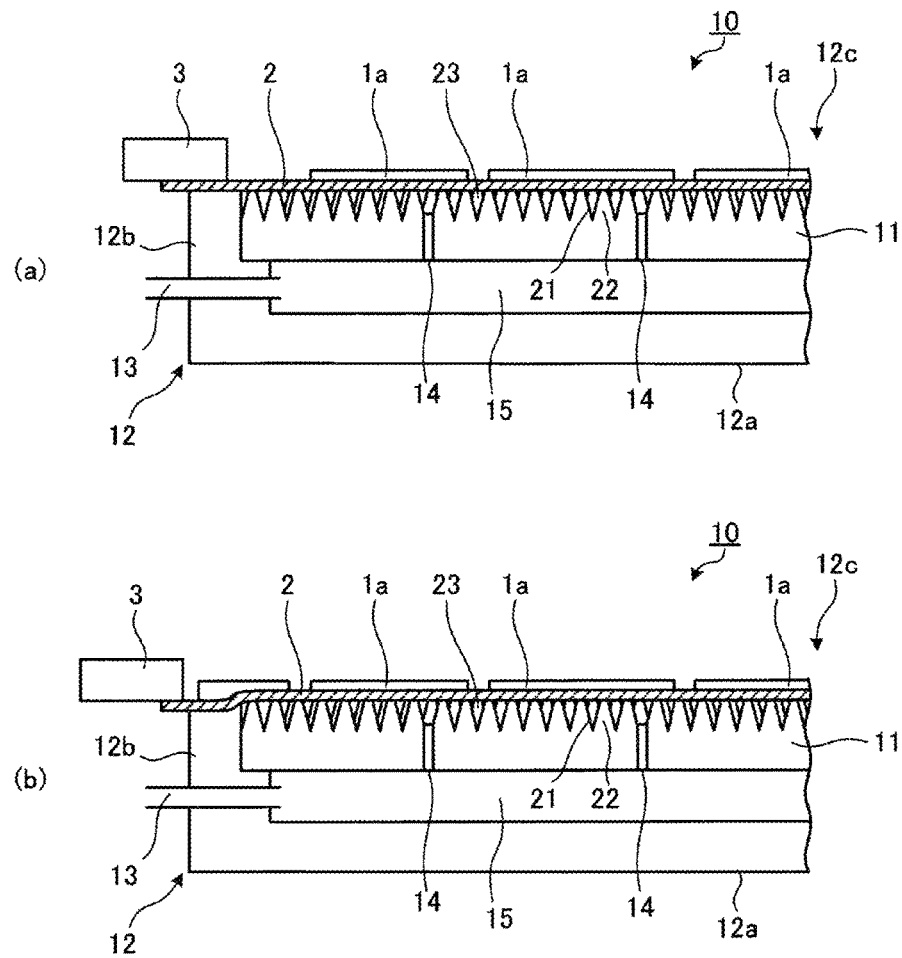
FIGS. 7(a) and 7(b) are cross-sectional views showing the semiconductor chips in a state of being mounted on the holding stage in the fabrication system of semiconductor devices according to some embodiments.

Next, an explanation will be made with respect to the positional relationship among the first and second grooves 21*a* and 21*b*, the projections 22 and the semiconductor chip 1*a*. FIG. 6 is a plan view showing a semiconductor chip in a state of being mounted on the holding stage in the fabrication system of semiconductor devices according to some embodiments. Moreover, FIG. 7 is a cross-sectional view showing the semiconductor chip in a state of being mounted on the holding stage in the fabrication system of semiconductor devices according to the embodiment. In FIG. 6, the semiconductor chip 1*a* is mounted on the first stage 11 with the adhesive sheet put in between although illustrations thereof are omitted.

As shown in FIG. 6, the semiconductor chip 1*a* is mounted on the first stage 11 so that the whole first end portion 1*d*-1 corresponding to one side of the semiconductor chip 1*a* positions on neither the first grooves 21*a* nor the second grooves 21*b*. Specifically, the semiconductor chip 1*a* is mounted on the first stage 11 so that the direction of the first end portion 1*d*-1 of the semiconductor chip 1*a* forms a specified angle $\theta$ with the direction of the first groove 21*a* (or the second groove 21*b*). This makes the top portion 22*a* of at least one projection 22 in contact with the first end portion 1*d*-1 of the semiconductor chip 1*a* on the first stage 11 side surface of the semiconductor chip 1*a*.

In FIG. 6, a state is shown in which the direction of the first end portion 1*d*-1 of the semiconductor chip 1*a* and the direction of the first groove 21*a* form a specified angle $\theta$. Hereafter, explanation will be made on condition that the direction of the first end portion 1*d*-1 of the semiconductor chip 1*a* and the direction of the first groove 21*a* form the specified angle $\theta$. Moreover, in FIG. 6, the projections 22 on which the semiconductor chip 1*a* is mounted are shown in dotted lines.

With the positions of the first end portion 1*d*-1 of the semiconductor chip 1*a* and the first grooves 21*a* determined in this way, by a negative pressure applied by the evacuation means, portions of the adhesive sheet 2 facing the first and the second grooves 21*a* and 21*b* are removed from the semiconductor chip 1*a* to thereby make the semiconductor chip 1*a* held only with the top portions 22*a* of the projections 22. At this time, a force attracts the first end portion 1*d*-1 of the semiconductor chip 1*a* downward (onto the first stage 11 side) by the adhesive sheet 2 is made to be distributed.

Specifically, when the semiconductor chip 1*a* is held only by the top portions 22*a* of the projections 22, the adhesive sheet 2 is brought into a state of being in close contact with the semiconductor chip 1*a* only at portions corresponding to the top portions 22*a* of the projections 22. Thus, on the first stage 11 side surface of the semiconductor chip 1*a*, the top portion 22*a* of at least one of the projections 22 is in contact with the first end portion 1*d*-1 of the semiconductor chip 1*a*, by which it becomes possible to make portions producing an attraction force by the adhesive sheet 2 and portions producing no such attraction force appear in the first end portion 1*d*-1 of the semiconductor chip 1*a*.

Moreover, also with respect to a second end portion 1*d*-2 to a fourth end portion 1*d*-4 corresponding to the other sides of the semiconductor chip 1*a*, similarly to the first end portion 1*d*-1 of the semiconductor chip 1*a*, the semiconductor chip 1*a* is mounted on the first stage 11 so that the direction of each of the second end portion 1*d*-2 to the fourth end portion 1*d*-4 forms the specified angle $\theta$ with the direction of the first groove 21*a* or the second groove 21*b*. Specifically, when the direction of the first end portion 1*d*-1 of the semiconductor chip 1*a* and the direction of the first groove 21*a* form the angle $\theta$, the semiconductor chip 1*a* is mounted on the first stage 11 so that the direction of each of the second and the fourth end portions 1*d*-2 and 1*d*-4 forms the angle $\theta$ with the direction of the second groove 21*b* and the direction of the third end portion 1*d*-3 forms the angle $\theta$ with the direction of the first grooves 21*a*.

By thus determining the positions of the second end portion 1*d*-2 to the fourth end portion 1*d*-4 of the semiconductor chip 1*a* to the first and second grooves 21*a* and 21*b*, on the surface on the first stage 11 side of the semiconductor chip 1*a*, the top portion 22*a* of at least one of the projections 22 makes contact with each of the second end portion 1*d*-2 to the fourth end portion 1*d*-4 of the semiconductor chip 1*a*. Therefore, similarly to the first end portion 1*d*-1 of the semiconductor chip 1*a* explained in the foregoing, an attraction force by the adhesive sheet 2 is produced only at portions in contact with the top portions 22*a* of the projections 22 in each of the second end portion 1*d*-2 to the fourth end portion 1*d*-4 of the semiconductor chip 1*a*.

The distribution of the attraction force applied by the adhesive sheet 2 in each of the first end portion 1*d*-1 to the fourth end portion 1*d*-4 of the semiconductor chip 1*a* makes it possible to avoid adhesion of the adhesive sheet 2 applied to the semiconductor chip 1*a* from becoming locally strong. Thus, when the semiconductor chip 1*a* is picked up by a collet, it is possible to prevent the semiconductor chip 1*a*, having the adhesive sheet 2 removed from the portions facing the first and second grooves 21*a* and 21*b*, from being made inclined to the upper surface of the first stage 11.

For adjusting the positioning of the semiconductor chip 1*a* to the first stage 11 so that the direction of each of the first end portion 1*d*-1 to the fourth end portion 1*d*-4 of the semiconductor chip 1*a* forms the specified angle $\theta$ with the direction of each of the first and second grooves 21*a* and 21*b*, it is necessary only that the first stage 11 is made to be rotated to the semiconductor chip 1*a* to be mounted on the first stage 11, for example. In this case, the pick up system can be provided with a detecting unit and a driving mechanism. The detecting unit detects, for example, the positions of the first end portion 1*d*-1 to the fourth end portion 1*d*-4 of the semiconductor chip 1*a* before being mounted on the first stage 11 and the angle $\theta$ which the direction of each of the first end portion 1*d*-1 to the fourth end portion 1*d*-4 forms with the direction of each of the first and second grooves 21*a* and 21*b*. The driving mechanism turns the first stage 11 around the center axis of the first stage 11.

Moreover, by turning the dicing frame 3 supporting the adhesive sheet 2, the angle $\theta$ can be adjusted which the direction of each of the first end portion 1*d*-1 to the fourth end portion 1*d*-4 of the semiconductor chip 1*a* forms with the first and second grooves 21a and 21b of the first stage 11. In this case, after the semiconductor chip 1a is mounted on the first stage 11, for example, the dicing frame 3 may be turned around the center axis of the semiconductor wafer 1 (the semiconductor chip 1a before dicing) by the driving mechanism provided in the pick up system.

Furthermore, before the semiconductor chip 1a is mounted on the first stage 11 by a carrying means that carries the semiconductor chip 1a to the holding stage 10 in the pick up system, the angle θ which the direction of each of the first end portion 1d-1 to the fourth end portion 1d-4 forms with the direction of each of the first and second grooves 21a and 21b may be adjusted by turning the dicing frame 3 around the center axis of the semiconductor wafer 1.

In FIG. 6, an explanation was made with respect to one semiconductor chip 1a mounted on the first stage 11. However, the other semiconductor chips, adjacent to the semiconductor chip 1a and the illustration thereof omitted, are also mounted on the first stage 11 so that the direction of each of the end portions thereof form the angle θ with the direction of each of the first and second grooves 21a and 21b like the semiconductor chip 1a explained in the foregoing. The state, in which the semiconductor chips 1a are mounted on the first stage 11 with the angle θ adjusted which angle the direction of each of the first and third end portions 1d-1 and 1d-3 of the semiconductor chip 1a forms with the direction of the first groove 21a and the direction of each of the second and fourth end portions 1d-1 and 1d-3 of the semiconductor chip 1a forms with the direction of the second groove 21b as shown in the plan view of FIG. 6, is shown in the cross-sectional view of FIG. 7(a).

FIG. 7(a) shows a cross-sectional structure when the holding stage 10 is cut along a cutting line in parallel with the first end portion 1d-1 of the semiconductor chip 1a mounted on the first stage 11, for example. As shown in FIG. 7(a), the semiconductor chip 1a is mounted on the first stage 11 with the adhesive sheet 2 provided in between, by which the semiconductor chip 1a is brought into contact with the top portions 22a of a plurality of the projections 22 with the adhesive sheet 2 put in between. With this, a closed space 23 is formed which is surrounded by the adhesive sheet 2, the side walls of the first and second grooves 21a and 21b of the first stage 11 and the second stage 12. FIG. 7(b) is a cross-sectional view showing a state with the rib section of a ribbed wafer being remained. As shown in FIG. 7(b), the upper surface of the second stage 12 is made to be lower by the thickness of the rib section of the ribbed wafer than the upper surface of the first stage 11 in order that the holding stage 10 may be applicable to a ribbed wafer. Hence, also in the ribbed wafer, in the same way as that in the flat semiconductor wafer shown in FIG. 7(a), the closed space 23 is formed which is surrounded by the adhesive sheet 2, the side walls of the first and second grooves 21a and 21b of the first stage 11 and the second stage 12.

Figure 8:
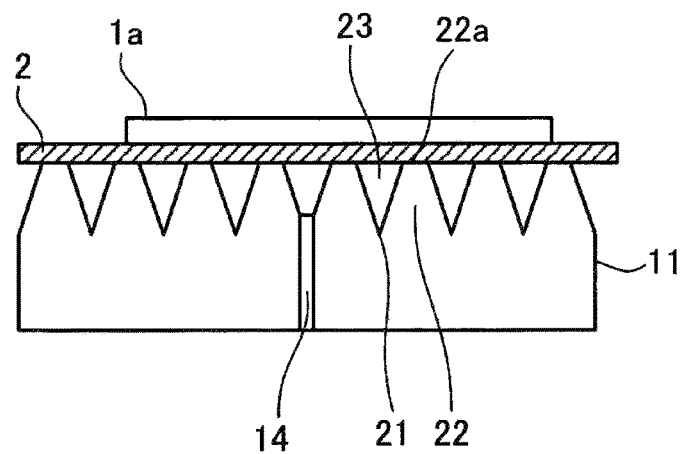
FIG. 8 is a cross-sectional view showing one of the semiconductor chips in a state of being mounted on the holding stage as shown in FIG. 7 in the fabrication system of semiconductor devices according to some embodiments.

In the next, an explanation will be made with respect to a pick up method of the semiconductor chip 1a by a pick up system according to the embodiment. FIGS. 8 to 11 are cross-sectional views showing operations of the fabrication system of semiconductor devices according to the embodiment in order. FIGS. 8 to 11 show with respect to one of the semiconductor chips 1a mounted on the upper surface of the first stage 11 in the holding stage 10 as shown in FIG. 7. First, as shown in FIG. 8, a semiconductor chip 1a secured to the dicing frame 3 is mounted on the upper surface of the first stage 11 with the surface on the side having the adhesive sheet 2 stuck thereto down.

This brings the semiconductor chip 1a into a state of being in contact with the top portions 22a of a plurality of the projections 22 with the adhesive sheet 2 put in between. Thus, the closed space 23 is formed which is surrounded by the adhesive sheet 2, the side walls of the groove 21 (the first and second grooves 21a and 21b) of the first stage 11 and the second stage 12. At this time, as was explained in the foregoing, the top portion 22a of at least one projection 22 is in contact with each of the end portions of the semiconductor chip 1a.

Figure 9:
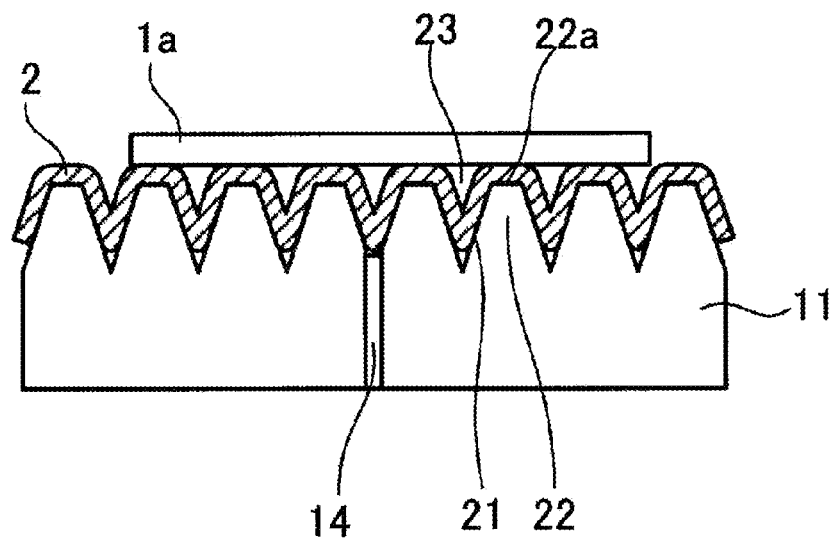
FIG. 9 is a cross-sectional view showing a state in which subsequent to the state shown in FIG. 8, a closed space surrounded by the adhesive sheet and the side walls of the grooves of the stage is evacuated to make the adhesive sheet removed from the semiconductor chip.

Then, by an evacuation means (not shown), the closed space 23 is evacuated through the air holes 14. This produces a negative pressure in a section facing the groove 21 in the adhesive sheet 2 stuck to the semiconductor chip 1a to make only the adhesive sheet 2 deformed along the side walls of the grooves 21. In this way, as shown in FIG. 9, portions facing the grooves 21 in the adhesive sheet 2 are removed from the semiconductor chip 1a to bring the adhesive sheet 2 into a state of being stuck to the semiconductor chip 1a only at portions corresponding to the top portions 22a of the projections 22. This brings the adhesive sheet 2 into a state of being almost removed from the semiconductor chip 1a to reduce the adhesion between the semiconductor chip 1a and the adhesive sheet 2 to the extent that the semiconductor chip 1a and the adhesive sheet 2 can be separated from each other only by the suction of a collet 31 shown in FIG. 10.

Figure 10:
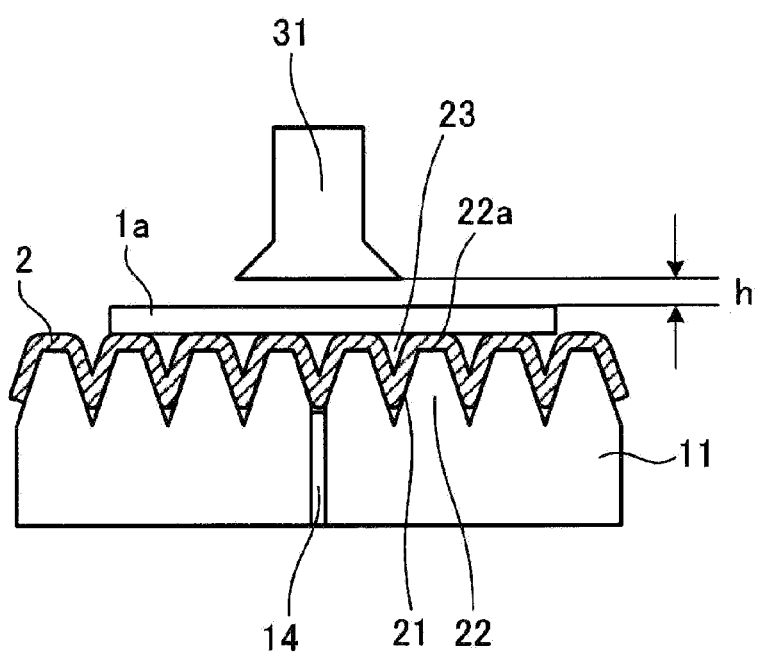
FIG. 10 is a cross-sectional view showing a state in which, subsequent to the state shown in FIG. 9, a collet is arranged above the semiconductor chip.

Subsequent to this, as shown in FIG. 10, by the collet 31, arranged above the semiconductor chip 1a with a specified spacing "h" apart from the semiconductor chip 1a held on the top portions 22a of the projections 22, suction is applied to the semiconductor chip 1a to attracted to the collet 31. As was explained in the foregoing, each of the end portions of the semiconductor chip 1a is in contact with the top portion of at least one projection 22. Thus, when suction is applied to the semiconductor chip 1a by the collet 31, no semiconductor chip 1a is made inclined to the upper surface of the first stage 11.

Sufficiently reduced adhesion between the semiconductor chip 1a and the adhesive sheet 2 allows the spacing "h" between the collet 31 and the semiconductor chip 1a to be equal to or less than 1 mm, for example. This permits the collet 31 to pick up the semiconductor chip 1a only by the suction of the collet 31. In addition, the semiconductor chip 1a is preferably picked up without making the collet 31 pushed to the semiconductor chip 1a. Thus, it is necessary only that the spacing "h" between the collet 31 and the semiconductor chip 1a is a spacing that makes no collet 31 pushed to the semiconductor chip 1a. Moreover, the collet 31 may be in contact with the semiconductor chip 1a. That is, the spacing "h" between the collet 31 and the semiconductor chip 1a is preferably 0 mm or more. By taking the spacing "h" between the collet 31 and the semiconductor chip 1a as being 0 mm or more, such a structure as a device structure formed on the surface of the semiconductor chip 1a can be prevented from being damaged.

Figure 11:
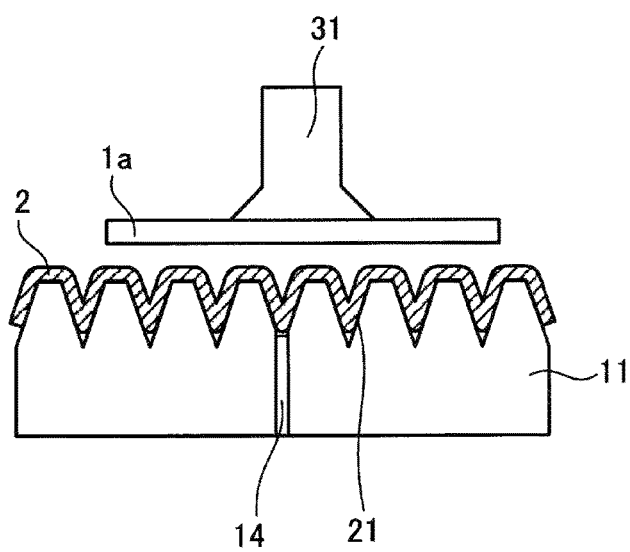
FIG. 11 is a cross-sectional view showing a state in which, subsequent to the state shown in FIG. 10, the semiconductor chip is picked up from the holding stage by the collet.

Furthermore, while suction is applied to the semiconductor chip 1a by the collet 31, evacuation of the closed space 23 is continued by the evacuation means. This keeps the adhesive sheet 2 removed from the semiconductor chip 1a while being in contact with the side walls of the grooves 21. Thus, when suction is applied to the semiconductor chip 1a by the collet 31, no adhesive sheet 2 adheres to the collet 31. In this way, the semiconductor chip 1a is picked up from the first stage 11 as shown in FIG. 11.

When the pick up system is provided with a heating means, the closed space 23 can be evacuated by the evacuation means while heating the adhesive sheet 2 by the heating means. By heating the adhesive sheet 2 with the heating means, the adhesive sheet 2 becomes easily deformable. Thus, the adhesive sheet 2 is easily deformed along the side walls of the grooves 21 in the first stage 11 to be removed from the semiconductor chip 1*a*.

In the next, an explanation will be made with respect to the structure for mounting the semiconductor chip 1*a* on the holding stage 10 (a driving means, hereinafter referred to as a structure for carrying out alignment of the semiconductor chip 1*a* with the first stage 11) so that the direction of the end portion of the semiconductor chip 1*a* forms the specified angle θ with the direction of the groove 21 of the first stage 11. The pick up system can be made to have a structure in which the first stage 11 turns concentrically with the second stage 12.

First, before the semiconductor chip 1*a* is mounted on the first stage 11, the first stage 11 is made to mechanically turn around the center axis of the first stage 11 beforehand. The position of the end portion of the semiconductor chip 1*a* carried onto the first stage 11 by common carrying processing is always at the same position to the first stage 11. Thus, before the semiconductor chip 1*a* is mounted on the first stage 11, the first stage 11 is made to turn beforehand to the predetermined position of the end portion of the semiconductor chip 1*a*.

While, the semiconductor wafer 1 has the adhesive sheet 2 stuck onto it with high accuracy (for example, with such an error as ±3 degrees) by common bonding processing. Then, the semiconductor wafer 1 is, after being cut into individual semiconductor chips 1*a*, carried by common carrying processing onto the first stage 11 while being stuck to the adhesive sheet 2. As was explained in the foregoing, the first stage 11 has been turned beforehand to be aligned to the predetermined position of the end portion of the semiconductor chip 1*a*.

Thus, only by carrying and mounting the semiconductor chip 1*a* onto the first stage 11 by the common carrying processing, the semiconductor chip 1*a* is mounted on the first stage 11 so that the direction of the end portion of the semiconductor chip 1*a* forms a specified angle with the direction of the grooves 21 on the first stage 11. Therefore, the alignment of the semiconductor chip 1*a* to the first stage 11 can be carried out without using a special detecting mechanism.

Figure 12:
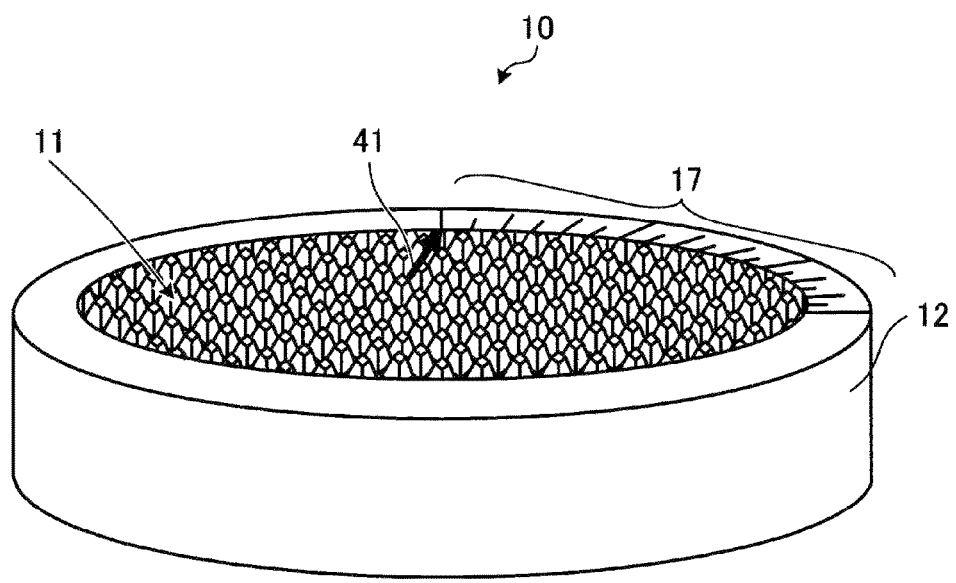
FIG. 12 is a perspective view schematically showing a pick up system in the fabrication system of semiconductor devices according to some embodiments.
Figure 13:
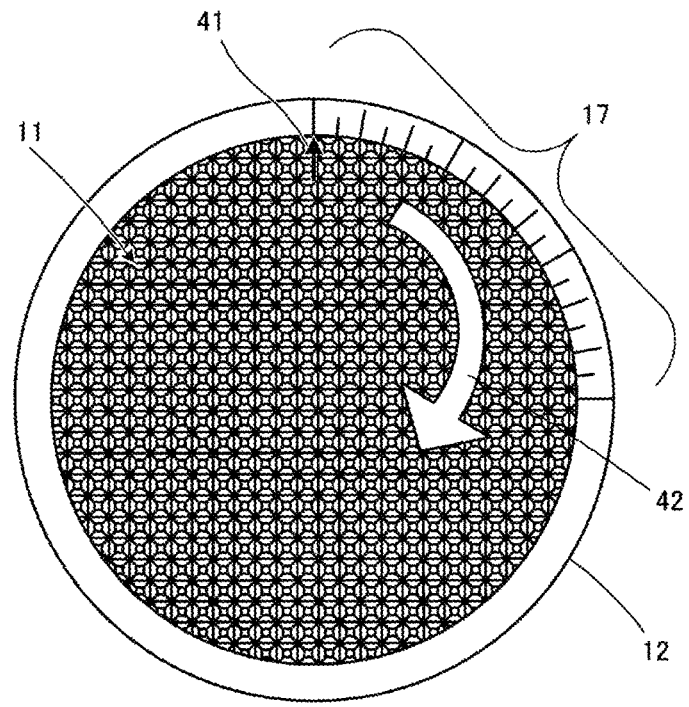
FIG. 13 is a plan view showing an operation of the pick up system in the fabrication system of semiconductor devices shown in FIG. 12.

Here, a method of turning the first stage 11 will be specifically explained. FIG. 12 is a perspective view schematically showing a pick up system in the fabrication system of semiconductor devices according to the embodiment. FIG. 13 is a plan view showing an operation of the pick up system in the fabrication system of semiconductor devices shown in FIG. 12. In FIGS. 12 and 13, the holding stage 10 of the pick up system is shown. The pick up system, for turning only the first stage 11 around the center axis of the first stage 11, can be provided with devices such as a motor (not shown) for turning the first stage 11 and a control circuit (not shown) for controlling the integrated number of revolutions of the motor. The first stage 11 and the second stage 12 are assembled with only the first stage 11 being turnable.

As is shown in FIG. 12, on the upper surface of the second stage 12, a scale 17 is provided for measuring the turning angle of the first stage 11. Thus, as is shown in FIG. 13, with the longitudinal direction in the drawing taken as the reference of the direction of the grooves 21 in the first stage 11, the first stage 11 is made to turn by a specified angle around the center axis thereof in the direction indicated by a white arrow 42. Then, the semiconductor chip 1*a* is mounted on the first stage 11 with the scheduled direction of an end portion of the semiconductor chip 1*a*, which is indicated by a black arrow, aligned to the graduation mark in the reference direction on the scale 17. This allows the alignment of the semiconductor chip 1*a* and the first stage 11 to be carried out. The alignment of the scheduled direction of the end portion of the semiconductor chip 1*a* to the reference direction of the scale 17 may be carried out with the use of an instrument such as a camera (not shown) provided above the first stage 11.

In the next, another example of the structure for aligning the semiconductor chip 1*a* to the first stage 11 will be explained. Normally, a pick up system is provided with an image processing unit for obtaining image information of the semiconductor chip 1*a* and the holding stage 10. Thus, the alignment of the semiconductor chip 1*a* to the first stage 11 can be carried out on the basis of images obtained by the image processing unit. In this case, the image processing unit carries out image pickup of the semiconductor chips 1*a* and the holding stage 10 from above the holding stage 10.

Figure 14:
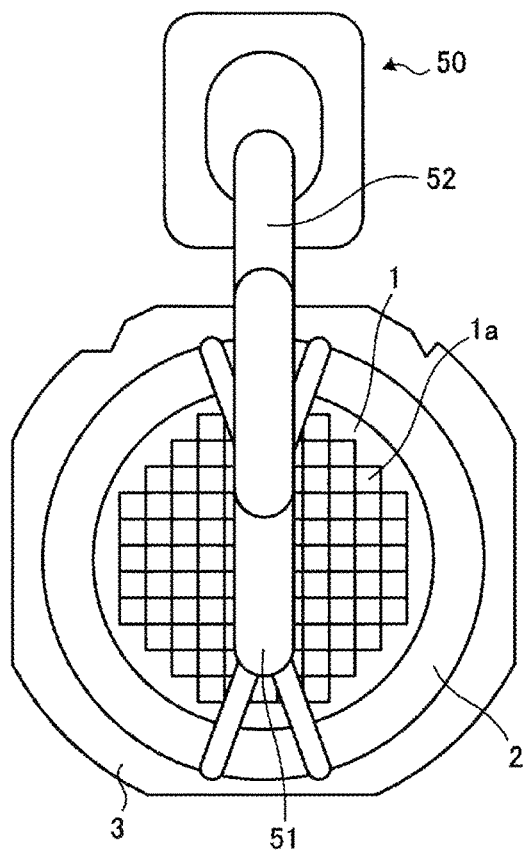
FIG. 14 is a plan view schematically showing a pick up system in another example of the fabrication system of semiconductor devices according to some embodiments.
Figure 15:
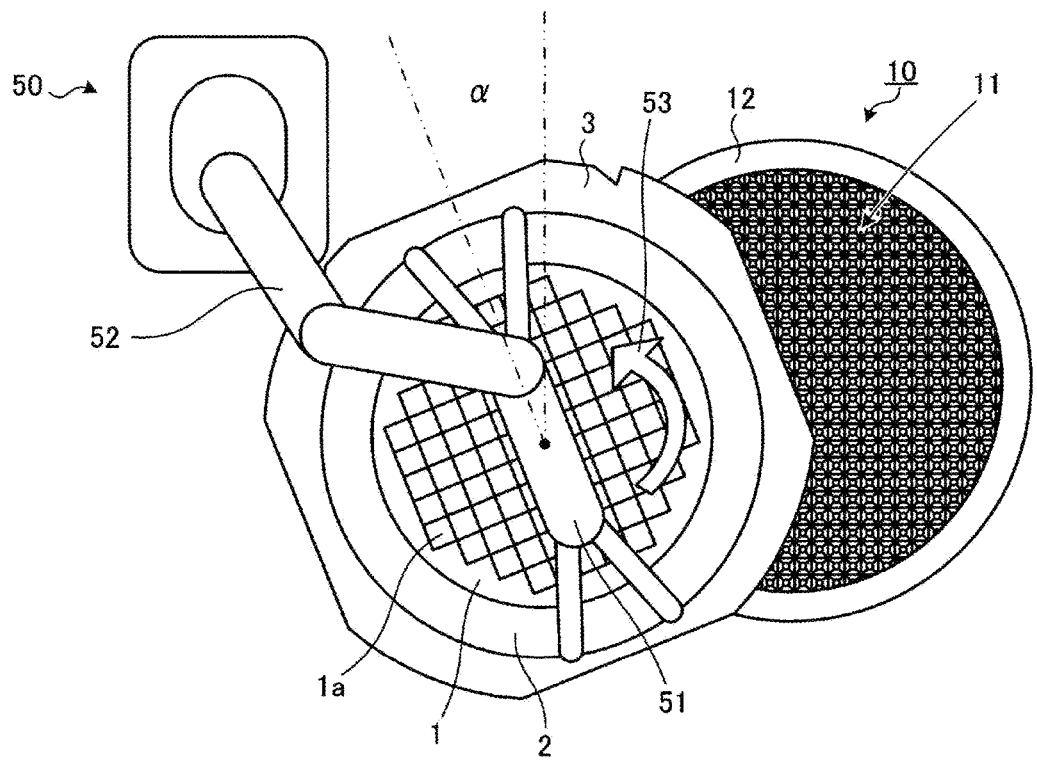
FIG. 15 is a plan view showing an operation of the pick up system of the fabrication system of semiconductor devices shown in FIG. 14.
Figure 16:
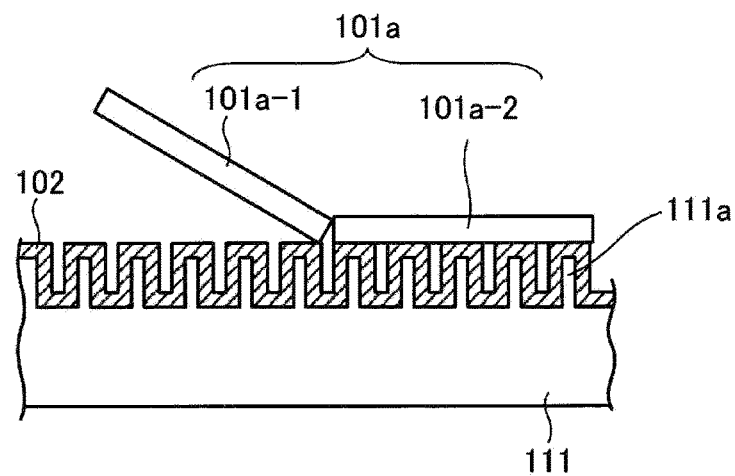
FIG. 16 is a cross-sectional view showing semiconductor chips in a state of being held on a holding stage in a related fabrication system of semiconductor devices.

Specifically, the alignment of the semiconductor chip 1*a* and the first stage 11 is carried out as follows. FIG. 14 is a plan view schematically showing a pick up system in another example of the fabrication system of semiconductor devices according to the embodiment. FIG. 15 is a plan view showing an operation of the pick up system of the fabrication system of semiconductor devices shown in FIG. 14. As is shown in FIG. 14, the pick up system is further provided with a common carrying means 50 carrying the semiconductor chip 1*a* and an image processing unit (not shown), for example. The carrying means 50 is provided with a holding unit 51 holding the semiconductor chip 1*a* and an arm 52 changing the position of the holding unit 51, for example. The semiconductor wafer 1 is secured to the dicing frame 3 in a state of being stuck to the adhesive sheet 2.

First, by the holding unit 51 of the carrying means 50, the semiconductor wafer 1 is held which is cut into individual semiconductor chips 1*a* in a state of being stuck to the adhesive sheet 2. Thereafter, by moving the arm 52 connected to the holding unit 51, the semiconductor chips 1*a* are carried to a position above the first stage 11. Then, by the image processing unit, images of the semiconductor chips 1*a* and the first stage 11 are taken from above the holding stage 10. The images taken by the image processing unit can be those in which positions such as the positions of the end portions of the semiconductor chips 1*a* and the positions of the longitudinal ends of the grooves 21 on the first stage 11 can be recognized. For example, an image taken by the image processing unit is schematically shown in FIG. 15.

Subsequent to this, on the basis of the images taken by the image processing unit, information is obtained with respect to the position of the end portion of each of the semiconductor chips 1*a* and the position of the longitudinal end of each of the grooves 21. Then, as is shown in FIG. 15, on the basis of the obtained information with respect to the positions, a deviation angle α from the specified angle θ, which the direction of the end portion of the semiconductor chip 1*a* is to form with the direction of the groove 21, is compensated. Specifically, by turning the semiconductor chip 1*a* around the center axis thereof with the carrying means 50 as is shown by a white arrow 53, the deviation angle α is compensated.

After this, by the carrying means 50, the semiconductor wafer 1 is mounted on the fixed first stage 11. This makes the semiconductor chip 1*a* mounted so that the direction of the end portion thereof forms the specified angle θ with the longitudinal grooves 21 on the first stage 11. In the pick up system that carries out alignment of the semiconductor chip 1a and the first stage 11 on the basis of the image obtained by an image processing unit, the first stage 11 can be made to have been turned beforehand without making the semiconductor chip 1a turned. In this case, alignment of the semiconductor chip 1a with the first stage 11 can be carried out by common carrying processing.

Moreover, in addition to being in the foregoing example for bringing the semiconductor chip 1a and the first stage 11 in alignment, in common carrying processing, for example, the dicing frame 3 is always mounted at the same position to the first stage 11. Therefore, after the semiconductor chip 1a is stuck to the adhesive sheet 2 and the dicing frame 3 so that the direction of the end portion of the semiconductor chip 1a and the direction of the groove 21 of the first stage 11 form the specified angle θ, the semiconductor chip 1a can be mounted on the first stage 11 by common carrying processing. Also in this case, the alignment of the semiconductor chip 1a and the first stage 11 can be carried out only by common carrying processing.

As was explained in the foregoing, according to the embodiment, the semiconductor chip 1a is mounted on the first stage 11 so that the direction of each of the first end portion 1d-1 and the third end portion 1d-3 and the direction of each of the second end portion 1d-2 and the fourth end portion 1d-4 form the specified angle θ with the direction of each of the first grooves 21a and the direction of each of the second grooves 21b, respectively. This makes, on the first stage 11 side surface of the semiconductor chip 1a having a rectangular plan shape, the top portion 22a of at least one projection 22 is brought into contact with at least one of the first end portion 1d-1 to the fourth end portion 1d-4 of the semiconductor chip 1a with the adhesive sheet 2 put in between. Thus, by an evacuation means, the closed space 23 surrounded by the adhesive sheet 2 and the side walls of the grooves 21 is evacuated. Consequently, when portions of the adhesive sheet 2 facing the grooves 21 are removed from the semiconductor chip 1a, on the first stage 11 side of the semiconductor chip 1a, in each of the first end portion 1d-1 to the fourth end portion 1d-4, there are produced portions stuck to the adhesive sheet 2 and portions not stuck to the adhesive sheet 2. Therefore, when suction is applied to the semiconductor chip 1a by a suction means (or suction device), the attraction force exerted by the adhesive sheet 2 to attract each of the first end portion 1d-1 to the fourth end portion 1d-4 of the semiconductor chip 1a toward the first stage 11 side is made to be distributed. Thus, when suction is applied to the semiconductor chip 1a by the suction means, no semiconductor chip 1a is brought into a state of being inclined to the first stage 11. This can prevent the semiconductor chip 1a from being chipped and scratched due to the semiconductor chip 1a being made inclined to the first stage 11. Consequently, the semiconductor chip 1a can be removed from the adhesive sheet 2 to be picked up in a high quality condition.

According to the invention explained in the foregoing, evacuation of the closed space 23 surrounded by the adhesive sheet 2, the side walls of the grooves 21 of the first stage 11 and the second stage 12 with the evacuation means makes portions of the adhesive sheet 2 facing the grooves 21 removed from the semiconductor chip 1a, by which the semiconductor chip 1a comes to be held only by a plurality of the top portions 22a with the adhesive sheet 2 put in between. This can reduce the adhesion between the semiconductor chip 1a and the adhesive sheet 2 to the extent that allows the semiconductor chip 1a to be picked up only by the suction force of the suction means. Thus, the semiconductor chip 1a can be surely removed from the adhesive sheet 2 to be picked up. Moreover, since the adhesion between the semiconductor chip 1a and the adhesive sheet 2 can be reduced to the extent that allows the semiconductor chip 1a to be picked up only by the suction force of the suction means, when the semiconductor chip 1a is picked up by the suction means, there is no need of carrying out processing of pushing the semiconductor chip 1a upward by a tool such as a needle like in the related method. Hence, the top surface of the semiconductor chip 1a can be prevented from being scratched by a tool such as a needle. Consequently, the semiconductor chip 1a can be removed from the adhesive sheet 2 to be picked up in a high quality condition.

Furthermore, according to the invention explained in the foregoing, the adhesion between the semiconductor chip 1a and the adhesive sheet 2 can be reduced to the extent that allows the semiconductor chip 1a to be picked up only by the suction force of the suction means. Thus, without making the collet 31 pushed onto the semiconductor chip 1a, the semiconductor chip 1a can be made to be surely picked up by the suction of the collet 31.

In this way, the semiconductor chip 1a on the first stage 11 can be picked up without making the semiconductor chip 1a inclined to the first stage 11 and without causing the semiconductor chip 1a to be chipped or cracked. This makes it possible to pick up the thinned semiconductor chip 1a by the pick up system according to the embodiment, by which the thinned semiconductor chip 1a can be safely carried.

In the foregoing, the invention is explained with the structure having the first and second grooves provided in lattice-like in the first stage taken as an example. The invention, however, is not limited to the embodiment explained in the foregoing but can be provided with a structure in which the semiconductor chip can be mounted on the first stage so that the direction of the end portion of the semiconductor chip and the direction of the groove form a specified angle. For example, a structure can be provided as one in which only the first grooves are provided in stripe-like. Moreover, also in the case when an electrode such as a bottom surface electrode is formed on the bottom surface side of a thinned semiconductor wafer before the adhesive sheet is stuck onto the bottom surface of the thinned semiconductor wafer, the invention can provide the same advantages.

As was explained in the foregoing, the fabrication method of semiconductor devices and the fabrication system of semiconductor devices are useful when semiconductor chips subjected to dicing cut are picked up from an adhesive sheet to be separated into individual semiconductor chips.

While the present invention has been particularly shown and described with reference to the preferred embodiment thereof, it will be understood by those skilled in the art that the foregoing and other changes in form and details can be made therein without departing from the spirit and scope of the present invention.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments and/or drawings can be combined, as would be understood by one of skill in the art.

This application is based on, and claims priority to, Japanese Patent Application No. 2011-227472, filed on Oct. 14, 2011, and Japanese Patent Application No. 2012-172117, filed on Aug. 2, 2012. The disclosures of the priority applications, in their entirety, including the drawings, claims, and the specifications thereof, are incorporated herein by reference.

What is claimed is:

1. A method of fabricating semiconductor devices by picking up a rectangular semiconductor chip including two short end portions and two long end portions, which is formed by cutting a semiconductor wafer stuck to an adhesive sheet with dicing, from the adhesive sheet, the method comprising the steps of:

preparing a stage having a plurality of grooves on the upper surface thereof, an evacuation means, and a suction means applying suction to the semiconductor chip, the plurality of grooves including a first group of grooves and a second group of grooves, the first group of grooves perpendicularly intersecting the second group of grooves, adjacent grooves of the first group of grooves being spaced at a first predetermined interval, adjacent grooves of the second group of grooves being spaced at a second predetermined interval, the length of the first and second intervals each being less than a length of the short end portions of the semiconductor chip;

turning the stage so that an end portion of a longitudinal direction of each of the first group of grooves of the stage forms a predetermined angle θ to one of the end portions of the semiconductor chip;

mounting the semiconductor chip on the stage, after the step of turning the stage, with the side of the surface of the semiconductor chip having the adhesive sheet stuck thereto made to be on the stage side while maintaining the predetermined angle θ;

making the semiconductor chip held at top portions formed by the end portions on the opening side of the grooves on the stage, after the step of mounting, with the adhesive sheet put in between with a space, surrounded by the adhesive sheet contacting the stage and the grooves on the stage, being evacuated by the evacuation means, each of the end portions of the semiconductor chip being in contact with at least one of the top portions; and applying suction to the semiconductor chip held at the top portions, after the step of making the semiconductor chip held, by the suction means to pick up the semiconductor chip.

2. The method of fabricating semiconductor devices as claimed in claim 1,
wherein a plane being in area contact with the semiconductor chip is provided on each of the top portions,
wherein in the step of turning the stage, the stage is turned adjusting the predetermined angle θ so that at least one of the planes of the top portions of the stage is in contact with all of the four sides of the chip.

3. The method of fabricating semiconductor devices as claimed in claim 1, wherein in the step of turning the stage, the predetermined angle θ is an angle larger than zero.

4. A method of fabricating semiconductor devices by picking up a rectangular semiconductor chip including two short end portions and two long end portions, which is formed by cutting a semiconductor wafer stuck to an adhesive sheet with dicing, from the adhesive sheet, the method comprising the steps of:

preparing a stage having a plurality of grooves on the upper surface thereof, an evacuation means, and a suction means applying suction to the semiconductor chip, the plurality of grooves including a first group of grooves and a second group of grooves, the first group of grooves perpendicularly intersecting the second group of grooves, the first group of grooves perpendicularly intersecting the second group of grooves, adjacent grooves of the first group of grooves being spaced at a first predetermined interval, adjacent grooves of the second group of grooves being spaced at a second predetermined interval, the length of the first and second intervals each being less than a length of the short end portions of the semiconductor chip;

turning the semiconductor chip so that one of the end portions of the semiconductor chip forms a predetermined angle θ to the end portion of a longitudinal direction of each of the first group of grooves of the stage;

mounting the semiconductor chip on the stage, after the step of turning the semiconductor chip, with the side of the surface of the semiconductor chip having the adhesive sheet stuck thereto made to be on the stage side while maintaining the predetermined angle θ;

making the semiconductor chip held at top portions formed by the end portions on the opening side of the grooves on the stage, after the step of mounting, with the adhesive sheet put in between with a space, surrounded by the adhesive sheet contacting the stage and the grooves on the stage, being evacuated by the evacuation means, each of the end portions of the semiconductor chip being in contact with at least one of the top portions; and applying suction to the semiconductor chip held at the top portions, after the step of making the semiconductor chip held, by the suction means to pick up the semiconductor chip, wherein in the step of turning the semiconductor chip, the predetermined angle θ is an angle larger than zero degrees and not an even multiple of 90 degrees.

5. The method of fabricating semiconductor devices as claimed in claim 4,
wherein a plane being in area contact with the semiconductor chip is provided on each of the top portions,
wherein in the step of turning the semiconductor chip, the semiconductor chip is turned adjusting the predetermined angle θ so that at least one of the planes of the top portions of the stage is in contact with all of the four sides of the semiconductor chip.

* * * * *